(12) United States Patent
Zhai et al.

(10) Patent No.: US 10,869,381 B2
(45) Date of Patent: Dec. 15, 2020

(54) HEAT SINK FOR PLUG-IN CARD, PLUG-IN CARD INCLUDING HEAT SINK, AND ASSOCIATED MANUFACTURING METHOD

(71) Applicant: EMC IP Holding Company LLC, Hopkinton, MA (US)

(72) Inventors: Haifang Zhai, Shanghai (CN); Hendry Xiaoping Wu, Shanghai (CN); David Dong, Shanghai (CN); Yujie Zhou, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/783,257

(22) Filed: Feb. 6, 2020

(65) Prior Publication Data

US 2020/0178383 A1     Jun. 4, 2020

Related U.S. Application Data

(63) Continuation of application No. 16/381,620, filed on Apr. 11, 2019, now Pat. No. 10,602,602.

(30) Foreign Application Priority Data

Apr. 28, 2018  (CN) .......................... 2018 1 0399388

(51) Int. Cl.
*H05K 1/02*     (2006.01)
*F28F 13/00*    (2006.01)
*H05K 7/20*     (2006.01)

(52) U.S. Cl.
CPC ........... *H05K 1/0201* (2013.01); *F28F 13/00* (2013.01); *H05K 7/2039* (2013.01); *H05K 7/2049* (2013.01); *F28F 2215/12* (2013.01)

(58) Field of Classification Search
CPC .................................................. H05K 7/2049
See application file for complete search history.

(56) References Cited

U.S. PATENT DOCUMENTS

| | | | |
|---|---|---|---|
| 4,448,240 A * | 5/1984 | Sharon | H01L 23/4338 165/185 |
| 4,498,530 A * | 2/1985 | Lipschutz | H01L 23/3672 165/185 |
| 4,770,242 A | 9/1988 | Daikoku et al. | |
| 5,345,107 A | 9/1994 | Daikoku et al. | |
| 5,515,912 A | 5/1996 | Daikoku et al. | |
| 5,595,240 A * | 1/1997 | Daikoku | H01L 23/4338 165/185 |

(Continued)

*Primary Examiner* — Robert J Hoffberg
(74) *Attorney, Agent, or Firm* — Ryan, Mason & Lewis, LLP

(57) ABSTRACT

Various embodiments of the present disclosure provide a heat sink for a plug-in storage card and a plug-in storage card including the heat sink. The heat sink comprises a first part secured to a surface of the plug-in storage card and a second part coupled to the first part and being movable relative to the first part in a first direction, wherein the first direction is perpendicular to the surface of the plug-in storage card. In this way, when the second part and the first part have a larger overlap in the first direction, the heat sink has a smaller first height and when the second part and the first part have a smaller overlap in the first direction, the heat sink has a greater second height.

20 Claims, 5 Drawing Sheets

(56) References Cited

U.S. PATENT DOCUMENTS

| | | | |
|---|---|---|---|
| 5,705,850 A * | 1/1998 | Ashiwake | H01L 23/4338 |
| | | | 257/706 |
| RE35,721 E * | 2/1998 | Daikoku | H01L 23/4338 |
| | | | 165/185 |
| 5,751,062 A * | 5/1998 | Daikoku | H01L 23/4338 |
| | | | 257/713 |
| 6,205,023 B1 | 3/2001 | Moribe et al. | |
| 6,496,369 B2 | 12/2002 | Nakamura | |
| 6,604,575 B1 | 8/2003 | Degtiarenko | |
| 6,665,184 B2 | 12/2003 | Akselband | |
| 6,906,922 B2 | 6/2005 | Yu et al. | |
| 7,133,285 B2 | 11/2006 | Nishimura | |
| 7,277,291 B2 * | 10/2007 | Ross | H01L 23/4338 |
| | | | 165/104.33 |
| 8,570,744 B2 | 10/2013 | Rau et al. | |
| 8,767,403 B2 | 7/2014 | Rau et al. | |
| 9,366,482 B2 * | 6/2016 | Yang | F28D 15/02 |
| 9,657,933 B2 * | 5/2017 | Clark | F21V 29/763 |
| 9,791,501 B2 | 10/2017 | Diglio et al. | |
| 2006/0060328 A1 * | 3/2006 | Ewes | H01L 23/427 |
| | | | 165/80.2 |
| 2006/0087816 A1 * | 4/2006 | Ewes | F28F 3/02 |
| | | | 361/704 |
| 2012/0293952 A1 | 11/2012 | Herring et al. | |
| 2014/0090816 A1 * | 4/2014 | Yang | F28D 15/0241 |
| | | | 165/104.26 |
| 2020/0045850 A1 * | 2/2020 | Bala | H01L 23/433 |

\* cited by examiner

HEAT SINK FOR PLUG-IN CARD, PLUG-IN CARD INCLUDING HEAT SINK, AND ASSOCIATED MANUFACTURING METHOD

RELATED APPLICATION(S)

The present application is a continuation of U.S. patent application Ser. No. 16/381,620, filed Apr. 11, 2019, now issued as U.S. Pat. No. 10,602,602, and is entitled "Heat Sink for Plug-In Card, Plug-In Card Including Heat Sink, and Associated Manufacturing Method," which claims priority to Chinese Patent Application No. 201810399388.5, filed Apr. 28, 2018, each of which is incorporated by reference herein in its entirety.

FIELD

Various embodiments of the present disclosure generally relate to the storage field, and more specifically, to a heat sink for a plug-in card, a plug-in card including the heat sink and an associated manufacturing method.

BACKGROUND

At present, plug-in cards that have been widely used in storage devices, such as Input/Output (I/O) cards, are usually equipped with heat sinks for cooling the plug-in cards. In some conditions, a larger heat sink may be needed to provide better heat dissipation performance so as to ensure normal operation of the plug-in card. However, a larger heat sink may have a greater thickness, while the chassis panel usually has openings with limited opening height. Therefore, the heat sink with greater thickness may create obstacles during the hot plug operation of the plug-in card.

SUMMARY

In a first aspect, a heat sink for a plug-in card is provided. The heat sink comprises a first part secured to a surface of the plug-in card and a second part coupled to the first part and being movable relative to the first part in a first direction perpendicular to the surface of the plug-in card, such that the heat sink has different heights with different overlaps between the first part and the second part. In this way, when the second part and the first part have a larger overlap in the first direction, the heat sink has a smaller first height, and when the second part and the first part have a smaller overlap in the first direction, the heat sink has a greater second height.

In some embodiments, the first part may have a first heat radiating fin extending along the first direction, and the second part may have a second heat radiating fin corresponding to the first heat radiating fin and extending along the first direction, wherein the first heat radiating fin and the second heat radiating fin are staggered in the first direction and are in a thermal contact, and there is an offset between the first heat radiating fin and the second heat radiating fin in a second direction perpendicular to the first direction; or the first radiating heat fin and the second heat radiating fin are aligned in the first direction, and at least a portion of the second heat radiating fin can be received in the first heat radiating fin and is in thermal contact with the first heat radiating fin.

In some embodiments, the heat sink may also comprise a first transmission mechanism pivotably coupled to a side wall of the plug-in card via a shaft oriented along a second direction, wherein the side wall extends along a third direction perpendicular to the first direction and the second direction, and wherein the first transmission mechanism includes a first end coupled to the shaft and a second end coupled to the second part of the heat sink.

In some embodiments, the first transmission mechanism is configured as a U-shaped component including two first ends and two second ends, wherein a bottom part of the U-shaped component couples the two second ends in the second direction across the second part of the heat sink, and an arm of the U-shaped component couples one of the two first ends to a corresponding one of the two second ends.

In some embodiments, the heat sink further may comprise a second transmission mechanism extending along the third direction and coupled to the first transmission mechanism, wherein the second transmission mechanism is adapted for causing the first transmission mechanism to apply a force having a component along the first direction on the second part, in response to a movement of the second transmission mechanism along the third direction.

In some embodiments, the heat sink may further comprise a first torsion spring rotatably coupled to the side wall via the shaft defined by the second direction, and the second transmission mechanism comprises a first protrusion protruding in the second direction, wherein an end of the first torsion spring is coupled to the first protrusion and a further end of the first torsion spring is coupled to the first end of the first transmission mechanism.

In some embodiments, the heat sink may further comprise a second torsion spring rotatably coupled to a bottom of the plug-in card via a shaft defined by the first direction and a pressing part operable to receive a press operation along the second direction. The pressing part includes a second protrusion protruding in the second direction, wherein the second transmission mechanism further includes a recess oriented along the first direction, wherein an end of the second torsion spring is coupled to the second protrusion, and a further end of the second torsion spring is coupled to the recess of the second transmission mechanism.

In a second aspect, a plug-in card is provided. The plug-in card comprises the heat sink according to the first aspect of the present disclosure.

In a third aspect, a method for manufacturing the heat sink according to the first aspect of the present disclosure is provided.

It should be appreciated that the Summary is not intended to identify key or essential features of the embodiments of the present disclosure, or limit the scope of the present disclosure. Other features of the present disclosure will be understood more easily through the following description.

BRIEF DESCRIPTION OF THE DRAWINGS

Through the detailed description of the example embodiments in the drawings, the features and advantages of the present disclosure will become easy to understand. In the drawings.

In all drawings, the same or similar reference number indicates the same or similar element.

DETAILED DESCRIPTION

Principles of the present disclosure are now described with reference to some example embodiments. It can be appreciated that description of those embodiments is merely to assist those skilled in the art to understand and implement the present disclosure and does not suggest any restrictions over the scope of the present disclosure. The contents disclosed here can be implemented in various methods apart from the following described ones.

As used herein, the term "includes" and its variants are to be read as open-ended terms that mean "includes, but is not limited to." The term "based on" is to be read as "based at least in part on." The term "an embodiment" is to be read as "at least one embodiment." The term "a further embodiment" is to be read as "at least a further embodiment."

As described above, most of the plug-in cards currently known or already in use, such as an Input/Output (I/O) card, are provided with heat sinks. However, on one hand, a larger heat sink might be needed to ensure normal operation of the plug-in card in some conditions (e.g., in an ambient temperature of up to 77° C.). However, a larger heat sink probably means a greater thickness. On the other hand, an opening that is opened on a chassis panel usually has a limited height due to the requirement for high density of I/Os in the storage system, which might cause obstacles when inserting a plug-in card of a heat sink with a greater height into the chassis.

Embodiments of the present disclosure provide a height adjustable heat sink for a plug-in card. When the plug-in card is being inserted into or pulled out from the chassis opening, the height of the heat sink described according to various embodiments of the present disclosure can be conveniently adjusted, which causes no obstacles for the hot plug operations of the plug-in card, and meanwhile enhances heat dissipation capability of the plug-in card.

The plug-in card described in the context, for example, can be an Open Compute Project (OCP) card, small I/O card and the like. For ease of discussion, height/thickness direction of the plug-in card is referred to as a first direction Z, width direction of the plug-in card is referred to as a second direction X, and length direction of the plug-in card is referred to as a third direction Y in the context. The first direction Z, the second direction X and the third direction Y are substantially perpendicular to one another.

Figure 1:
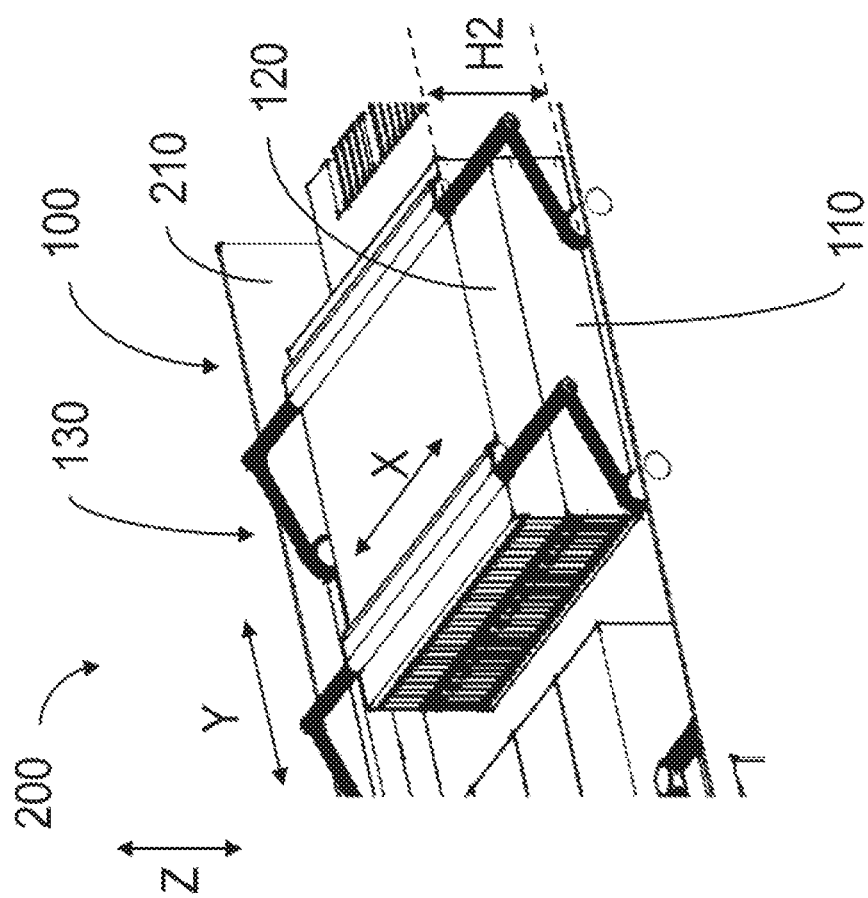
FIG. 1 illustrates a perspective view of a heat sink with a greater height according to an embodiment of the present disclosure.
Figure 2:
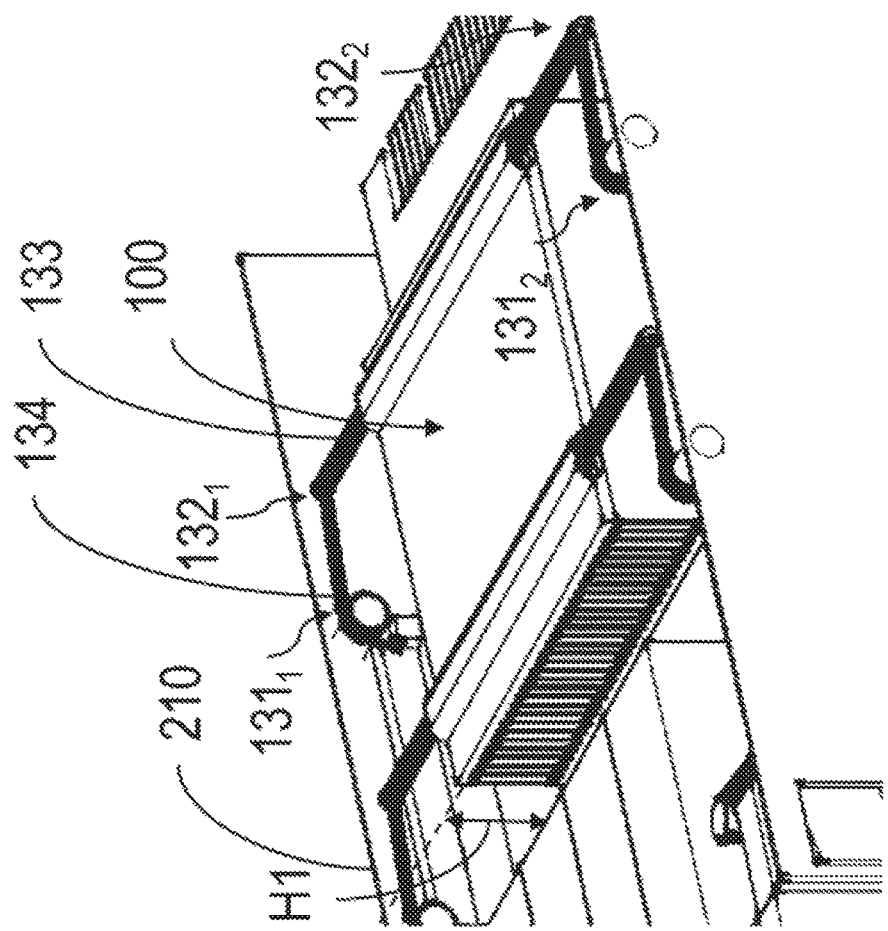
FIG. 2 illustrates a perspective view of a heat sink with a smaller height according to an embodiment of the present disclosure.

FIG. 1 and FIG. 2 respectively illustrate perspective views of a heat sink in two different states according to an embodiment of the present disclosure. FIG. 1 shows a heat sink with a greater height, while FIG. 2 demonstrates a heat sink with a smaller height.

As shown in FIG. 1, the heat sink 100 includes a first part 110 and a second part 120. The first part 110 is secured to a surface XY of the plug-in card 200 (or a plane where the plug-in card 200 is located), and the second part 120 is coupled to the first part 110 and movable relative to the first part 110 in the first direction Z. The first direction Z is perpendicular to the surface XY of the plug-in card 200.

By means of the relative movement in the first direction Z (i.e., in the height direction), the heat sink 100 can have a smaller, first height H1 when the second part 120 and the first part 110 have a larger overlap in the first direction Z (See, FIG. 2). Besides, when the second part 120 and the first part 110 have a smaller overlap in the first direction Z (See, FIG. 1), the heat sink 100 has a greater, second height H2.

In this way, a height-adjustable or telescopic/extendable heat sink 100 is implemented. As such, when the plug-in card 200 is being inserted into or being pulled out of the chassis opening, the heat sink 100 can be first adjusted to have a smaller height H1, such that the plug-in card 200 can be smoothly inserted or pulled out without hindrance. Then, the heat sink can be adjusted to a greater height H2 to improve its heat dissipation performance.

Figure 4:
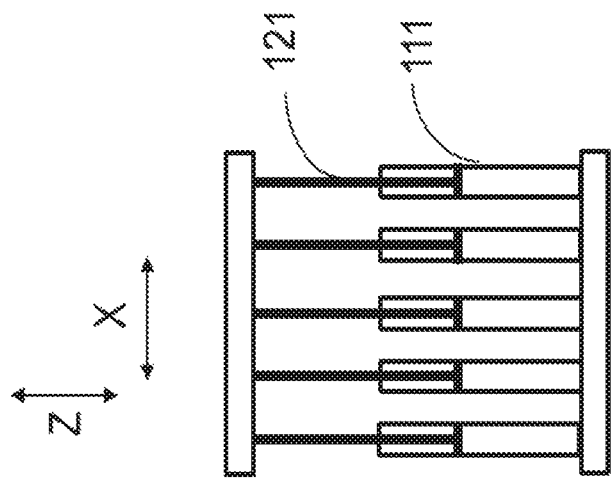
FIG. 4 illustrates a schematic diagram of a heat sink according to another embodiment of the present disclosure.
Figure 3:
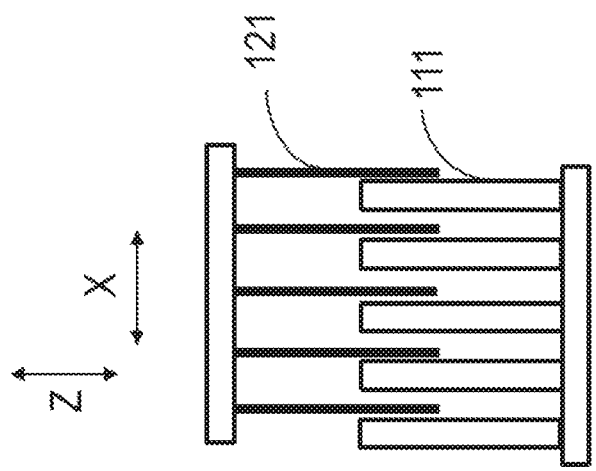
FIG. 3 illustrates a schematic diagram of a heat sink according to an embodiment of the present disclosure.

In some embodiments as shown in FIGS. 3 and 4, the first part 110 may have a first heat radiating fin 111 extending along the first direction Z, and the second part 120 may have a second heat radiating fin 121 corresponding to the first heat radiating fin 111 and extending along the first direction Z. Furthermore, the relative arrangement of the first heat radiating fin 111 to the second heat radiating fin 121 may also vary depending on various requirements or applications.

For example, in some embodiments as shown in FIG. 3, the first heat radiating fin 111 and the second heat radiating fin 121 can be staggered in the first direction Z, but maintaining thermal contact with each other, and there is an offset between the first heat radiating fin 111 and the second heat radiating fin 121 along the second direction X perpendicular to the first direction Z.

For another example, in some further embodiments as shown in FIG. 4, the first heat radiating fin 111 and the second heat radiating fin 121 can be aligned with each other in the first direction Z. At least a portion of the second heat radiating fin 121 can be received in the first heat radiating fin 111 and be in thermal contact with the first heat radiating fin 111. In other words, in this alternative embodiment, the second heat radiating fin 121 can either protrude from the first heat radiating fin 111 or retract within the first heat radiating fin 111 in order to achieve height adjustment.

The adjustment in heat dissipation performance as described above is based on the following recognition, that is, when the spacing between adjacent heat radiating fins remains constant, a larger area of the radiating fin can provide better heat dissipation performance because the contact area between the radiating fin and the surrounding cooling medium (such as air) is larger. Also, it is to be appreciated that the heat dissipation performance of the radiating fin can be further improved by additionally optimizing other factors, such as material and shape of the heat radiating fin.

Figure 5:
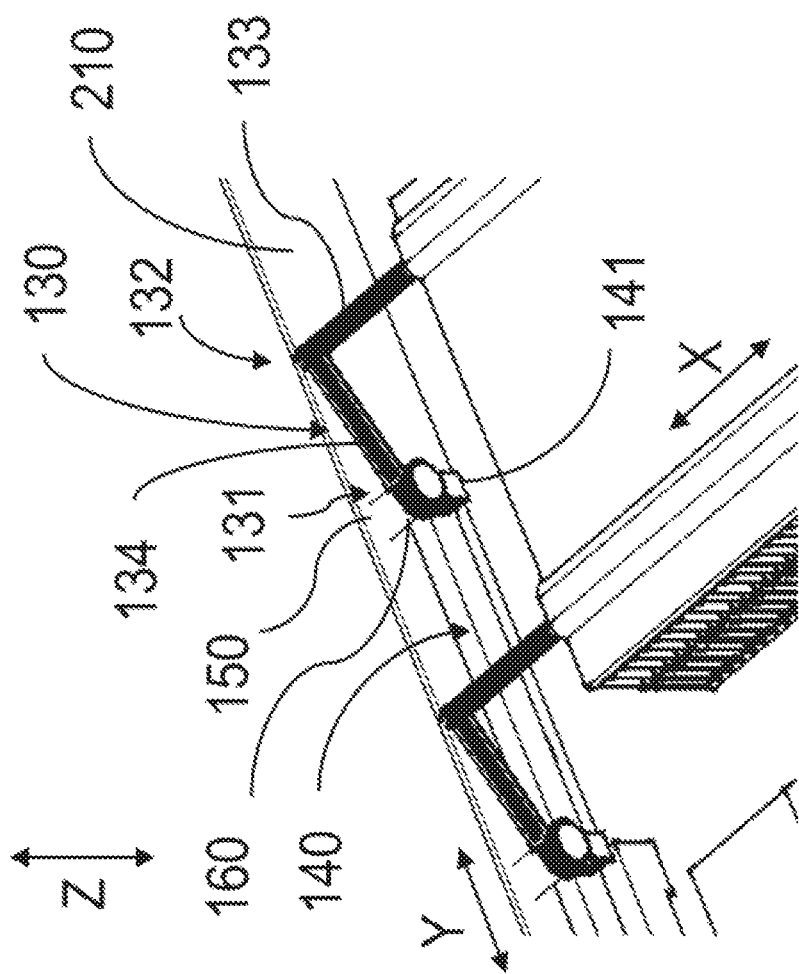
FIG. 5 illustrates a partial view of a heat sink according to an embodiment of the present disclosure.

FIG. 5 illustrates a partial view of the heat sink 100 according to an embodiment of the present disclosure. As shown in FIG. 5, in some embodiments, the heat sink 100 may also include a first transmission mechanism 130, which can be pivotably coupled to a side wall 210 of the plug-in card 200 via a shaft 150 oriented along the second direction X. As shown in FIG. 5, the side wall 210 extends along the third direction Y perpendicular to both the first direction Z and the second direction X. As further illustrated in FIG. 5, the first transmission mechanism 130 may include a first end 131 coupled to the shaft 150 and a second end 132 coupled to the second part 120 of the heat sink 100.

By means of the first transmission mechanism 130, the rotation of the first transmission mechanism 130 can be transformed into a force having a component along the first direction Z and applied onto the second part 120. Accordingly, height adjustment of the heat sink 100 can be implemented by a simple and direct force transmission manner.

In some embodiments, the first transmission mechanism 130 can be configured as a U-shaped component shown in FIG. 2. The U-shaped component includes two first ends $131_1$ and $131_2$ and two second ends $132_1$ and $132_2$. A bottom part 133 of the U-shaped component couples the two second ends $132_1$ and $132_2$ in the second direction X across the second part 120 of the heat sink 100. In other words, the bottom part 133 of the U-shaped component can be regarded as the extension of the two second ends $132_1$ and $132_2$ in the second direction X. In addition, an arm 134 of the U-shaped component also couples one of the two first ends $131_1$ and $131_2$ to a corresponding one of the two second ends $132_1$ and $132_2$.

Such U-shaped implementation not only provides a bottom part 133 extending in the entire width direction, but also provides two symmetrically arranged arms 134 for the first transmission mechanism 130. Therefore, a uniform distribution of the force in the width direction can be provided, which facilitates the manipulation to the second part 120 of the heat sink 100.

Alternatively, or in addition, a plurality of such transmission mechanisms 130 can be uniformly arranged along the third direction Y. For example, as shown in FIG. 2, a plurality of U-shaped components are arranged along the length direction to further implement uniform distribution of the force in the length direction. It is to be noted that the present disclosure does not seek to limit the amount or the distribution of the first transmission mechanism 130. Although the embodiment of FIG. 2 illustrates two U-shaped components, it is to be understood that more than two U-shaped components can be arranged depending on the requirements. Of course, a single U-shaped component also can achieve manipulation to the second part 120. It is also to be understood that the plurality of transmission mechanisms 130 can also be non-uniformly arranged in the length direction.

Continuing to refer to FIG. 5, the heat sink 100 may also include a second transmission mechanism 140, which extends along the third direction Y and is coupled to the first transmission mechanism 130. The second transmission mechanism 140 is adapted for enabling the first transmission mechanism 130 to apply a force having a component along the first direction Z onto the second part 120 in response to the movement of the second transmission mechanism 140 along the third direction Y.

By means of the second transmission mechanism 140, the translation of the second transmission mechanism 140 is transformed into the rotation of the first transmission mechanism 130, and the rotation of the first transmission mechanism 130 is further transformed into the movement of the second part 120 in the vertical direction. The second transmission mechanism 140, which can be operated in the translational movement, is more beneficial for the users to manipulate the heat sink 100.

Still referring to FIG. 5, in some embodiments, the heat sink 100 may also include a first torsion spring 160, which can be rotatably coupled to the side wall 210 via the shaft 150 defined by the second direction X. Correspondingly, the second transmission mechanism 140 may include a first protrusion 141 protruding in the second direction X. According to FIG. 5, one end of the first spring torsion 160 is coupled to the first protrusion 141 and the other end of the first torsion spring 160 is coupled to the first end 131 of the first transmission mechanism 130.

By means of the fit of the first torsion spring 160 with the first protrusion 141 of the second transmission mechanism 140 and with the first end 131 of the first transmission mechanism 130, the force transmission between the first transmission mechanism 130 and the second transmission mechanism 140 can be implemented under a simple and compact construction.

Figure 6:
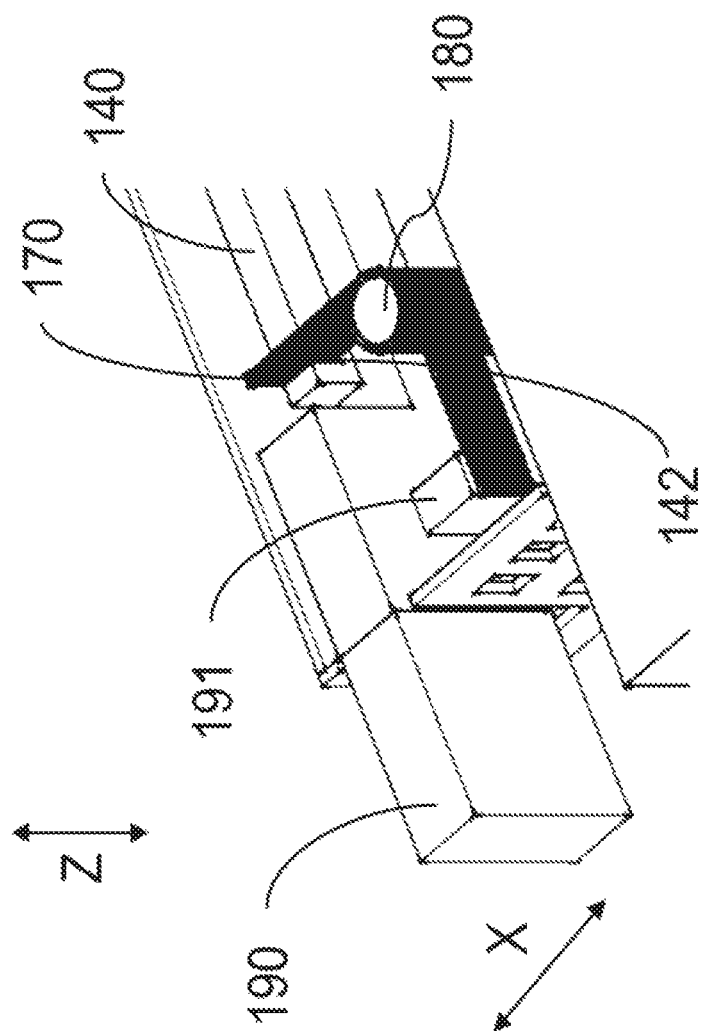
FIG. 6 illustrates a further partial view of a heat sink according to an embodiment of the present disclosure.

FIG. 6 illustrates a further partial view of the heat sink according to an embodiment of the present disclosure. As shown in FIG. 6, in some embodiments, the heat sink 100 may also include a second torsion spring 170, which can be rotatably coupled to the bottom of the plug-in card 200 via a shaft 180 defined by the first direction Z. Besides, the heat sink 100 may also include a pressing part 190, which can be operated to receive a press operation along the second direction X. In the example as shown in FIG. 6, the pressing part 190 includes a second protrusion 191 protruding in the second direction X, and the second transmission mechanism 140 further includes a recess 142 oriented along the first direction Z. As shown in FIG. 6, one end of the second torsion spring 170 is coupled to the second protrusion 191 and the other end of the second torsion spring 170 is coupled to the recess 142 of the second transmission mechanism 140.

By means of the fit of the second torsion spring 170 with the second protrusion 191 and the recess 142, force transmission or force interaction between the user and the second transmission mechanism 140 can also be implemented under a simple and compact construction. Besides, particularly by means of the pressing part 190 configured in such manner, the manipulation to the second part 120 of the heat sink 100 by the user can be further simplified. This is because the users can easily implement manipulation to the second part 120 of the heat sink 100 by simply performing a simple pinch operation in the horizontal direction. For example, when inserting/pulling the plug-in card 200 into/out from the chassis opening, the pressing part 190 can be conveniently pinched so as to first adjust the heat sink 100 to a smaller height H1. After the plug-in card is completely inside or outside the chassis, the pressing part 190 then can be released to adjust the heat sink back to the greater height H2.

Generally, although details of several implementations have been included in the above discussion, they should not be interpreted as any restrictions over the scope of the present disclosure. Instead, the details are descriptions of the features for the specific embodiments only. Certain features described in some separate embodiments also can be executed in combinations in a single embodiment. On the contrary, various features described in a single embodiment also can be implemented separately in multiple embodiments or in any suitable sub-combinations.

Although the present disclosure is described with specific structural features, it can be appreciated that the scope of the technical solution defined in the attached claims is not necessarily restricted to the above specific features. That is, the contents described above are optional embodiments of the present disclosure only. For those skilled in the art, embodiments of the present disclosure can have various modifications and changes. Any amendments, equivalent substitutions, improvements and the like are included in the protection scope of the present disclosure as long as they are within the spirit and principles of the present disclosure.

What is claimed is:
1. A device, comprising:
a plug-in storage card;
a heat sink associated with the plug-in storage card, the heat sink comprising:
a first part mounted relative to the plug-in storage card, the first part including a plurality of first heat radiating elements;

a second part mounted relative to the plug-in storage card and opposing the first part, the second part including a plurality of second heat radiating elements extending toward the first part, the first part and the second part being configured for relative movement between a first relative position defining a first vertical height of the heat sink and a second relative position defining a second relative height of the heat sink, the first vertical height being greater than the second vertical height;

a transmission member operatively coupled to the plug-in storage card and to at least one of the first part or the second part, the transmission member movable to cause corresponding relative movement of the first and second parts and adjustment of the heat sink between the first and second vertical heights; and a spring member operatively coupled to the transmission member and rotatably coupled to the plug-in storage card, the spring member configured to bias the first and second parts toward the first relative position.

2. The device of claim 1, wherein the first part is secured to the plug-in storage card.

3. The device of claim 1, wherein the transmission member is pivotally coupled to the plug-in storage card.

4. The device of claim 1, wherein the transmission member is configured to translate in a direction corresponding to a length direction of the plug-in card.

5. A device, comprising:
a plug-in storage card;
a heat sink associated with the plug-in storage card, the heat sink comprising:
a first part mounted relative to the plug-in storage card, the first part including a plurality of first heat radiating elements;
a second part mounted relative to the plug-in storage card and opposing the first part, the second part including a plurality of second heat radiating elements extending toward the first part, the first part and the second part being configured for relative movement to adjust a vertical height of the heat sink; and
a first transmission member coupled to the plug-in storage card and operatively coupled to one of the first and second parts, the first transmission member movable to cause corresponding relative movement of the first and second parts to adjust the vertical height of the heat sink;
wherein the second part is movably coupled to the plug-in storage card, the second part movable relative to the first part to adjust the vertical height of the heat sink;
wherein the first transmission member is operatively coupled to the second part and pivotally coupled to the plug-in storage card; and
wherein pivotal movement of the first transmission member causes movement of the second part to adjust the vertical height of the heat sink.

6. The device of claim 5, wherein the first heat radiating elements of the first part and the second heat radiating elements of the second part at least partially overlap when in at least one relative position of the first and second parts.

7. The device of claim 6, wherein the second part is movable relative to the first part between at least first and second relative positions of the first and second parts;

wherein in the first relative position, corresponding to a first height of the heat sink, the first heat radiating elements and the second heat radiating elements define a first degree of overlap;

wherein in the second relative position, corresponding to a second height of the heat sink, the first heat radiating elements and the second heat radiating elements define a second degree of overlap greater than the first degree of overlap; and wherein the first height of the heat sink is greater than the second height of the heat sink.

8. The device of claim 7, wherein individual ones of the first heat radiating elements and individual ones of the second heat radiating elements are staggered relative to each other.

9. The device of claim 7, wherein individual ones of the first heat radiating elements and individual ones of the second heat radiating elements are aligned relative to each other and disposed in telescopic arrangement.

10. The device of claim 5, wherein the first part is secured to the plug-in storage card.

11. The device of claim 5, including a second transmission member mounted relative to the heat sink and operatively coupled to the first transmission member, the second transmission member movable to cause pivotal movement of the first transmission member to thereby cause movement of the second part to adjust the vertical height of the heat sink.

12. The device of claim 11, including a first torsion spring mounted relative to the plug-in storage card and operatively coupling the first transmission member and the second transmission member.

13. The device of claim 11, including a manually engageable member operatively coupled to the second transmission member, the manually engageable member movable by a user to cause movement of the second transmission member and corresponding pivotal movement of the first transmission member to adjust the vertical height of the heat sink.

14. The device of claim 13, including a second torsion spring mounted relative to the plug-in storage card and operatively coupling the manually engageable member and the second transmission member;

wherein movement of the manually engageable member by the user causes the second transmission member to move in one direction and correspondingly reduce the vertical height of the heat sink; and wherein release of the manually engageable member permits the second transmission member to move in an opposite direction in response to a bias of the second torsion spring and correspondingly increase the vertical height of the heat sink.

15. A heat sink for a plug-in storage card, comprising:
a first part mounted relative to the plug-in storage card, the first part including a plurality of first heat radiating elements extending in a first direction;
a second part mounted relative to the plug-in storage card and opposing the first part, the second part including a plurality of second heat radiating elements extending in a second direction opposing the first direction toward the first part, the first part and the second part being configured for relative movement to adjust a vertical height of the heat sink; and
a first transmission member configured to be coupled to the plug-in storage card and operatively coupled to one of the first and second parts, the first transmission member movable to cause corresponding relative movement of the first and second parts to adjust the vertical height of the heat sink;

wherein the first part is configured to be secured to the plug-in storage card;

wherein the second part is operatively coupled to the first transmission member, the first transmission member configured to be pivotally coupled to the plug-in storage card; and wherein pivotal movement of the first transmission member causes corresponding movement of the second part to adjust the vertical height of the heat sink.

16. The heat sink of claim 15, wherein the second part is movable relative to the first part between at least first and second relative positions of the first and second parts;

wherein in the first relative position, corresponding to a first height of the heat sink, the first heat radiating elements and the second heat radiating elements define a first degree of overlap;

wherein in the second relative position, corresponding to a second height of the heat sink, the first heat radiating elements and the second heat radiating elements define a second degree of overlap greater than the first degree of overlap; and wherein the first height of the heat sink is greater than the second height of the heat sink.

17. The heat sink of claim 16, wherein individual ones of the first heat radiating elements and individual ones of the second heat radiating elements are one of staggered relative to each other and in aligned telescopic relation to each other.

18. The heat sink of claim 16, including a second transmission member mounted relative to the heat sink and configured to be operatively coupled to the first transmission member, the second transmission member movable to cause pivotal movement of the first transmission member to thereby cause movement of the second part to adjust the vertical height of the heat sink.

19. A method, comprising:

mounting a first part of a heat sink relative to a plug-in storage card, the first part including a plurality of first heat radiating elements extending in a first direction;

mounting a second part of the heat sink relative to the plug-in storage card in opposition to the first part, the second part including a plurality of second heat radiating elements extending in a second direction opposing the first direction and toward the first part;

moving the first part and the second part relative to each other through movement of a first transmission member coupled to the plug-in storage card to adjust a vertical height of the heat sink;

securing the first part of the heat sink to the plug-in storage card;

pivotally coupling the first transmission member to the plug-in storage card;

coupling the second part of the heat sink to the first transmission member; and pivotally moving the first transmission member to cause corresponding movement of the second part to adjust the vertical height of the heat sink.

20. The method of claim 19, wherein the first heat radiating elements of the first part and the second heat radiating elements of the second part at least partially overlap; and further including:

configuring individual ones of the first heat radiating elements of the first part and individual ones of the second heat radiating elements of the second part to be in one of staggered relation to each other and in aligned telescopic relation to each other.

* * * * *